United States Patent [19]

Lebesnerais

[11] 4,348,595

[45] Sep. 7, 1982

[54] CIRCUIT INCLUDING AT LEAST TWO MTL SEMI-CONDUCTING DEVICES SHOWING DIFFERENT RISE TIMES AND LOGIC CIRCUITS MADE-UP THEREFROM

[75] Inventor: Gerard M. Lebesnerais, Perthes, France

[73] Assignee: International Business Machines Corporation, Armonk, N.Y.

[21] Appl. No.: 186,829

[22] Filed: Sep. 12, 1980

[30] Foreign Application Priority Data

Oct. 30, 1979 [FR] France .............................. 79 27386

[51] Int. Cl.³ .................. H03K 3/286; G11C 19/28
[52] U.S. Cl. ............................... 307/221 R; 307/291; 307/303; 357/92
[58] Field of Search .................... 307/221 R, 291, 303, 307/459, 477; 357/92; 365/154, 187, 174, 188; 235/92 SH

[56] References Cited

U.S. PATENT DOCUMENTS

| | | | |
|---|---|---|---|
| 3,643,231 | 2/1972 | Lohrey et al. | 340/173 |
| 3,736,477 | 5/1973 | Berger et al. | 317/235 |
| 3,815,106 | 6/1974 | Wiedmann | 340/173 |
| 3,816,758 | 6/1974 | Berger et al. | 307/214 |
| 3,886,531 | 5/1975 | McNeill | 340/173 |
| 3,993,918 | 11/1976 | Sinclair | 307/279 |
| 4,021,786 | 5/1977 | Peterson | 340/173 |
| 4,090,255 | 5/1978 | Berger et al. | 365/154 |
| 4,197,470 | 4/1980 | Banzhaf | 357/92 |

OTHER PUBLICATIONS

"I²L/MTL Storage Cell Layout" by H. H. Berger et al., IBM TDB, vol. 22, No. 10, Mar. 1980, pp 4604-4605.

"MTL Storage Cell" by S. K. Wiedmann, IBM TDB, vol. 21, No. 1, Jun. 1978, pp. 231-232.

"Merged-Transistor Logic (MTL)-A Low-Cost Bipolar Logic Concept" by H. H. Berger et al., IEEE Journal of Solid-State Circuits, vol. SC-7, No. 5, Oct. 1972, pp. 340-346.

"Intebrated Injection Logic: A New Approach to LSI" by K. Hart et al., IEEE Journal of Solid-State Circuits, vol. SC-7, No. 5, Oct. 1972, pp. 346-351.

"I²L Takes Bipolar Integration a Significant Step Forward" by R. L. Horton et al., Electronics, Feb. 6, 1975, pp. 83-90.

"I²L Puts It All Together for 10-bit a-d Converter Chip" by P. Brokaw, Electronics Apr. 13, 1978, pp. 99-105.

"Integrated Injection Logic Shaping Up As Strong Bipolar Challenge to MOS", Electronic Design 6, Mar. 15, 1974, pp. 28 and 30.

Primary Examiner—John Zazworsky
Attorney, Agent, or Firm—Wesley DeBruin

[57] ABSTRACT

The basic circuit (FIG. 2) includes an input device (A) driving two output transistors (B) and (C) which have different rise times [injection currents (I2, I3) or the input characteristics of the transistors (capacitors C2, C3) may be adjusted]. In a preferred embodiment (FIG. 3) differentiation is ensured by coupling a control transistor D to one of the output transistors (B) through a PNP transistor. If transistors (B) and (C) are cross-coupled, the circuit which is achieved is a bistable device. FIG. 4 shows the layout of the circuit of FIG. 3. Various applications in the synchronous logic circuit domain are described: T flip-flop (FIG. 8) and shift register (FIG. 9).

41 Claims, 10 Drawing Figures

MTL (OR I²L) T FLIP-FLOP

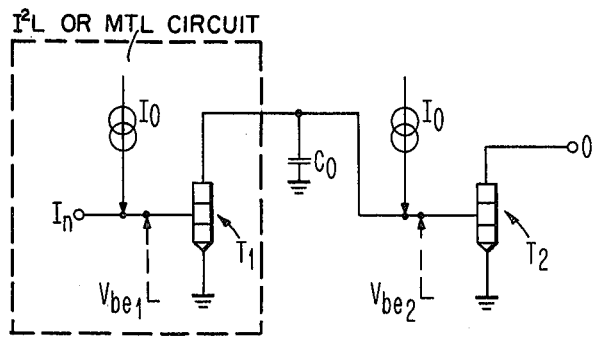
FIG. 1 $I_0$ REPRESENTS INJECTION CURRENT SOURCE PROVIDING CURRENT $I_0$ (OR $I_2, I_3$, ETC.) e.g. A PNP CURRENT SOURCE AS KNOWN TO $I^2L$ (OR MTL) TECHNOLOGY.
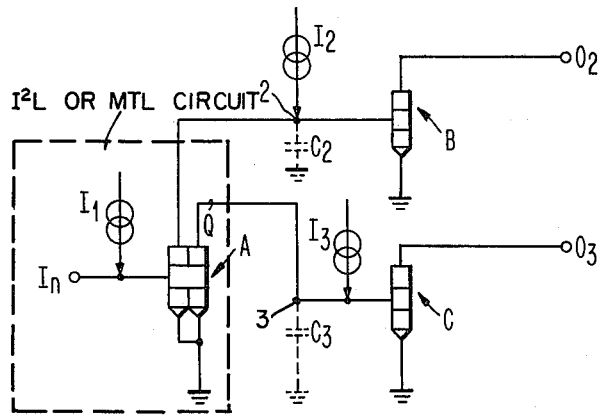
FIG. 2
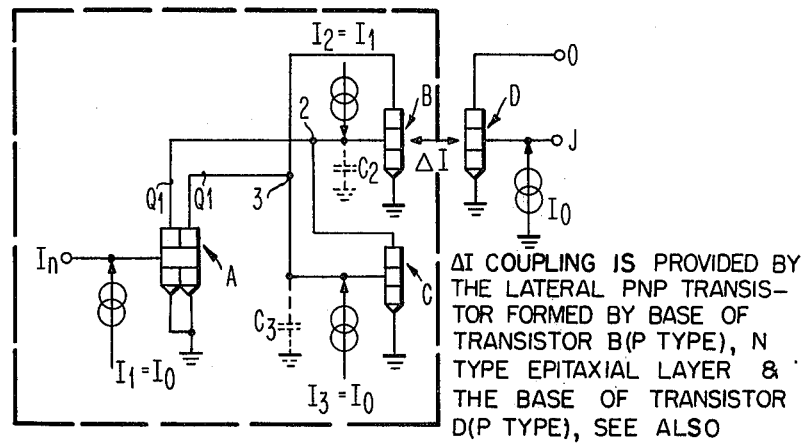
FIG. 3
ΔI COUPLING IS PROVIDED BY THE LATERAL PNP TRANSISTOR FORMED BY BASE OF TRANSISTOR B (P TYPE), N TYPE EPITAXIAL LAYER & THE BASE OF TRANSISTOR D (P TYPE), SEE ALSO FIG. 4.

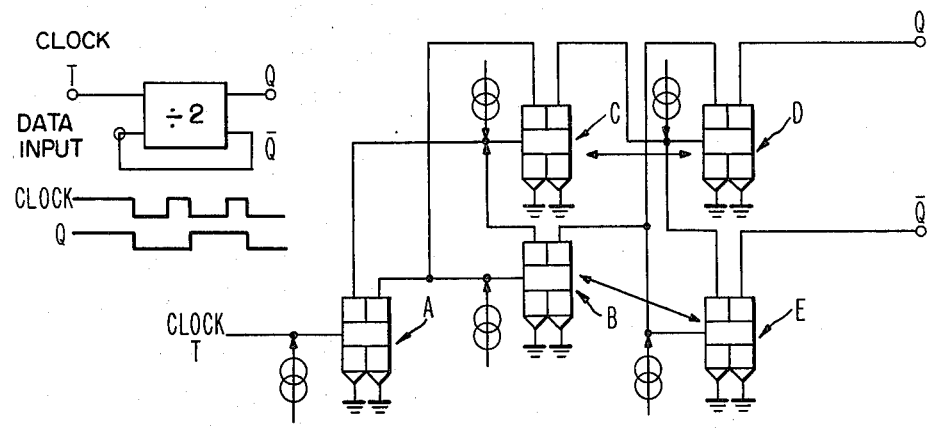
FIG. 8 MTL (OR $I^2L$) T FLIP-FLOP
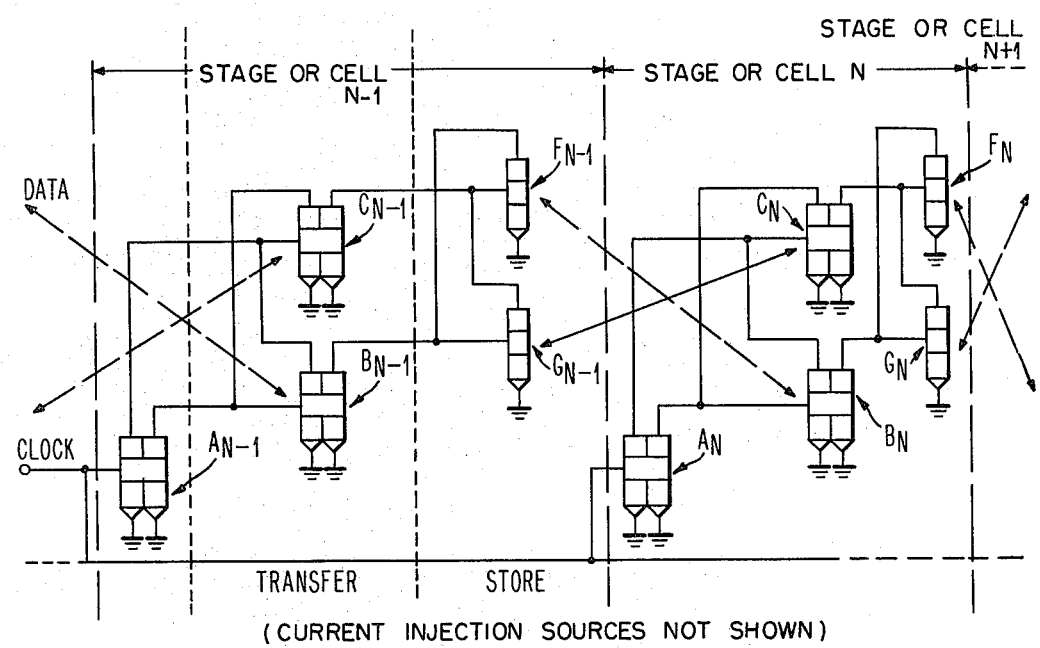
FIG. 9 MTL (OR $I^2L$) STATIC SHIFT REGISTER // CIRCUIT INCLUDING AT LEAST TWO MTL SEMI-CONDUCTING DEVICES SHOWING DIFFERENT RISE TIMES AND LOGIC CIRCUITS MADE-UP THEREFROM

FIELD OF THE INVENTION

This invention relates to circuits including MTL semiconducting devices and more particularly, to a basic circuit including transistors showing different rise times and driven by a device acting as an identical current-sink for these transistors. In a preferred embodiment, the rise times are differentiated by coupling one of said transistors to a control transistor through the base regions. This invention also relates to various applications of said basic circuit into synchronous logic circuits such as flip-flops, static shift registers, etc.

CROSS REFERENCE TO RELATED APPLICATIONS

U.S. patent application Ser. No. 101,366 entitled "Method and Circuit Arrangement For Controlling An Integrated Semiconductor Memory" filed Dec. 7, 1979 by K. Heuber and S. K. Wiedmann of common assignee herewith and granted on July 21, 1981 as U.S. Pat. No. 4,280,198.

U.S. patent application Ser. No. 136,859 entitled "Method of And Circuit Arrangement for Reading And/Or Writing An Integrated Semiconductor Storage with Storage Cells in MTL Technology" filed Apr. 3, 1980 by H. H. Heimer et al., and of common assignee herewith.

U.S. patent application Ser. No. 133,383 entitled "Integrated Semiconductor Memory and Method of Operating Same" filed Mar. 24, 1980 by H. H. Heimer et al., of common assignee herewith and granted on Jan. 26, 1982 as U.S. Pat. No. 4,313,179.

U.S. patent application Ser. No. 924,126 entitled "Semiconductor Integrated Injection Logic Structure Controlled by the Injector" filed July 13, 1978 by R. M. Hornung et al., of common assignee herewith and granted on July 7, 1981 as U.S. Pat. No. 4,277,701.

BACKGROUND OF THE INVENTION AND ART

The MTL (Merge Transistor Logic) technology also known as I²L (Integrated Injection Logic) is well known in the art. The history of this technology and the most important publications concerning this subject, can be found in French Patent Application No. 77/29867 filed on Sept. 28, 1977 by the applicant of the present invention, and published under U.S. Pat. No. 2,404,962. French Patent Application No. 77/29867—U.S. patent application Ser. No. 924,126 filed July 13, 1978 entitled "Semiconductor Integrated Injection Logic Structure Controlled by the Injector" by R. H. Hornung et al. and granted on July 7, 1981 as U.S. Pat. No. 4,277,701. The above indicated French patent shows how it is possible to obtain different response times by varying as required the spacing between the injection rail and the base of the various NPN transistors, and thus, to provide the injection with a logic control function, in particular for prepositioning flip-flops into a predetermined logic state when applying power.

Further, this technology (MTL or I²L) and its various applications has been described in a number of U.S. Patents and Publications, a number of which are identified below:

U.S. Pat. No. 3,643,231 entitled "Monolithic Associative Memory Cell" granted Feb. 15, 1972 to F. H. Lohrey and S. K. Wiedmann, and of common assignee herewith.

U.S. Pat. No. 3,736,477 entitled "Monolithic Semiconductor Circuit Concept of High Packing Density" granted May 29, 1973 to H. H. Berger and S. K. Wiedmann and of common assignee herewith.

U.S. Pat. No. 3,815,106 entitled "Flip-Flop Memory Cell Arrangement" granted June 4, 1974 to S. K. Wiedmann, and of common assignee herewith.

U.S. Pat. No. 3,816,758 entitled "Digital Logic Circuit" granted June 11, 1974 to H. H. Berger and S. K. Wiedmann, and of common assignee herewith.

U.S. Pat. No. 3,886,531 entitled "Schottky Loaded Emitter Coupled Memory Cell For Random Access Memory" granted May 27, 1975 to J. L. McNeill.

U.S. Pat. No. 3,993,918 entitled "Integrated Circuits" granted Nov. 23, 1976 to A. W. Sinclair.

U.S. Pat. No. 4,021,786 entitled "Memory Cell Circuit and Semiconductor Structure Therefore" granted May 3, 1977 to H. W. Peterson.

U.S. Pat. No. 4,090,255 entitled "Circuit Arrangement For Operating A Semiconductor Memory System" granted May 16, 1978 to H. H. Berger et al., and of common assignee herewith.

IBM Technical Disclosure Bulletin publication entitled "I²L/MTL Storage Cell Layout" by H. H. Berger et al., Vol. 22, No. 10, March 1980, pages 4604-5.

IBM Technical Disclosure Bulletin publication entitled "MTL Storage Cell" by S. K. Wiedmann, Vol. 21, No. 1, June 1978, pages 231-2.

"Merged-Transistor Logic (MTL)—A Low-Cost Bipolar Logic Concept" by Horst H. Berger and Siegfried K. Wiedmann, IEEE Journal of Solid-State Circuits, Vol. SC-7, No. 5, October 1972, pages 340-6.

"Integrated Injection Logic: A New Approach to LSI" by Kees Hart and Arie Slob, IEEE Journal of Solid-State Circuits, Vol. SC-7, No. 5, October 1972, pages 346-51.

"I²L Takes Bipolar Integration A Significant Step Forward" by R. L. Horton et al., Electronics, Feb. 6, 1975, pages 83–90.

"I²L Puts It All Together For 10-bit a-d Converter Chip" by Paul Brokaw, Electronics/Apr. 13, 1978, pages 99–105.

"Integrated Injection Logic Shaping Up As Strong Bipolar Challenge to MOS", Electronic Design 6, Mar. 15, 1974, pages 28 and 30.

SUMMARY OF THE INVENTION

Nowadays, a permanent tendency to miniaturize circuits appears in the micro-electronic technology. In effect, it is very important for the circuit designer to be able to increase the integration density of the circuits on the silicon wafers, either by improving the technology (by using ion implantation, electron-beam lithography, etc.), or by designing new circuits.

The MTL technology is very widely used in the manufacture of logic or analog circuits since it allows the density of the bipolar circuits to be increased.

In general, this invention as claimed hereinafter, resolves this problem. First of all, it relates to a MTL basic circuit including two output NPN transistors with different rise times and driven by an input transistor applying identical currents to said output NPN transistors. In particular, these different rise times can be obtained by coupling a control transistor to one of said output NPN transistors so that a PNP transistor is provided between the base of the driven output transistor and the base of the control transistor. Then, a flip-flop can be provided by cross-coupling both output transistors. It is also possible to obtain a T flip-flop by coupling two cross-coupled NPN transistors to the output NPN transistor. Also, a static shift register can be provided by adding a new buffer element.

Besides the better integration ensured by the increase of the circuit density for a particular function as described hereinafter, the processing speed and the electrical efficiency are also improved.

Specific features of the invention as well as specific objects and advantages thereof will become readily apparent from the following detailed description, taken in conjunction with the accompanying drawings.

BRIEF DESCRIPTION OF THE DRAWINGS

FIG. 1 shows two MTL (or I$^2$L) transistors mounted in cascade.

FIG. 2 shows two MTL (or I$^2$L) transistors driven by a single device in MTL (or I$^2$L) technology.

FIG. 3 shows the circuit of FIG. 2 in which one of the two transistors is provided with an additional coupling transistor.

FIG. 8 shows a MTL (or I$^2$L) T flip-flop in accordance with the invention.

FIG. 9 shows a MTL (or I$^2$L) static shift register in accordance with the invention.

DESCRIPTION OF THE INVENTION

I. Principle

The basic principle of this invention can be understood by referring to FIGS. 1 and 2.

FIG. 1 shows conventional (MTL) two-way transistors T1 and T2 which are mounted in cascade. The bases of transistors T1 and T2 are each connected to a current injector Io. Co represents the sum of the parasitic capacitances existing at this node (junction, diffusion and metal contact, capacitance, etc.). When potential $V_{be1}$ of the T1 base is high (in positive logic), potential $V_{be2}$ of the T2 base is low, and in fact, equal to saturation voltage ($V_{CE\,sat}$) of T1. When the potential of the T1 base goes low, the potential of the T2 base rises at the following rate $$dV/dt = Io/Co,$$

until it reaches its maximum voltage. Now, referring to FIG. 2, if one uses two identical transistors B and C (therefore C2=C3=Co) controlled by a same device A (in this case, a dual transistor with a single base electrode), controlled by various current sources I2 and I3, it is obvious that these transistors will go up at various rates and therefore, will show various rise times.

$$(dV/dt)_B = I2/Co \text{ and } (dV/dt)_C = I3/Co$$

That is to say that if, for instance I2>I3, the potential at node 2 rises faster than the potential at node 3.

It should be noted that such a result could also be achieved by modifying the values of the various capacitances, therefore, by choosing C2≠C3, and by using identical current injectors I2=I3=Io, or by using different transistors B and C (C2≠C3 or $V_{be2}$≠$V_{be3}$).

Therefore, it appears that if transistors B and C are interconnected to form a flip-flop (for instance, by a conventional cross-coupling of said transistors), the state of the flip-flop depends only on currents I2 and I3.

In practice, it is recommended to use identical transistors and identical current injection sources when designing the circuits. Thus, this invention suggests to couple a device to one of transistors B and C which will effectively control the current injected into said transistor B or C.

Figure 4:
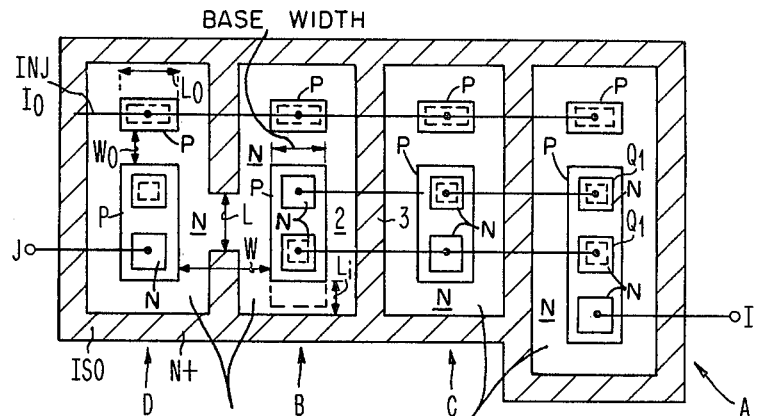
FIG. 4 shows the layout of the circuit of FIG. 3.

FIG. 3 shows transistors B and C which are cross-coupled to form a conventional bistable type cell. Identical transistors A, B and C powered by the same current source Io are used to make the description of the invention easier. A transistor D is coupled to transistor B to add current $+\Delta I$ or $-\Delta I$ to current $I_{B2}$ of the transistor B base, according to its logic state which is controlled by the level applied to input J. In MTL technology, said coupling between B and D can be achieved at the circuit layout level as shown in FIG. 4. FIG. 4 shows the lay out of the circuit of FIG. 3. FIG. 4 shows conventional MTL transistors A, B and C and their various interconnections, in particular the cross-coupling between the bases and the collectors of transistors B and C. Transistor D is also shown. All the transistors are located in an isolation pocket and are provided with the same injection current (INJ). In effect, the injection rail is segmented and the segments are connected to a voltage source Vo through a common lead and a resistor (not shown). The isolation walls ISO are conventionally made up by the N+ reach-through diffusion. (When fabricating conventional bipolar transistors, same diffusion is used to create the reach-through region which connects the collector contact region to the subcollector N+ buried region of a NPN transistor). Coupling between the bases of transistors B and D is achieved by discontinuing the isolation wall on a length L, as shown in FIG. 4. Thus, a lateral PNP transistor is provided between the base of B (of type P), the epitaxial layer (of type N) and the base of D (of type P) and will ensure the required additional injection.

It will be apparent from FIG. 4 that the emitter (P type) and collector (P type) of the lateral PNP transistor (which couples transistor B to transistor D in FIG. 3) each occupy essentially the same volume of monolithic semiconductor material as the bases of transistors B and D, respectively.

Solid state circuit means is a generic term which is employed and known in the art. Solid state circuit means includes transistors (or transistor) such as NPN and PNP devices, combinations thereof, integrated circuits, etc.

Passive connection means is a generic term which is employed and known in the art. Passive connection means includes wiring, metallurgy, semiconductor material, etc. used to interconnect circuit devices such as transistors, integrated circuits, etc. Passive connection means does not include active circuit devices, such as transistors, integrated circuits, etc.

The phrases "I²L circuit" and "MTL circuit" are well-known and extensively employed in the art. These phrases are used interchangeably herein. Further, attention is directed to FIGS. 1 and 2 of the drawing and in particular, to the circuitry enclosed by the broken line labelled "I²L or MTL Circuit".

Collector O of transistor D is not fully necessary for operating the circuit shown in FIG. 3. Therefore, in another embodiment, it could be cancelled and device D of FIG. 4 could only include the injector and the base.

The circuit operates as follows: if the D base level is low (on input J), D is off. When the B base potential goes high, a hole current ($\Delta I$) flows from the B base towards the D base which is the collector of the above defined lateral PNP transistor. Thus, capacitance C2 brought back to the B base, is charged at the following rate:

$$Io - \Delta I/C2.$$

This rate (Io − $\Delta I$/C2) defines the rise time of transistor B while a current Io charges capacitance C3 associated with transistor C. Then, from the earlier explanation (FIGS. 1 and 2, B is off and, therefore, C is on at the end of the charging operation.

Conversely, if the D base level is high, the hole current of the PNP transistor flows from the D base towards the B base. This time, the current which is going to charge capacitance C2 is equal to Io+$\Delta I$ and exceeds the current charging capacitance C3 of transistor C. And consequently, said transistor C is off while transistor B is on.

As to the efficiency of this type of coupling on the noise immunity, it should be understood that noise immunity is better when D is on than when it is off, merely because when beginning to charge capacitances C2 and C3, the difference between base currents $I_{B2}$ and $I_{B3}$ of B and C, respectively, is more important when D is on. D injects holes into the base of B as soon as the potential of the base of B increases. Conversely, when D is off, B injects holes into the base of D only when the potential of the base of B is high enough (i.e. at 0.6 V approx.). Then, it can be said that the injected current is significant, or more exactly, that the difference between $I_{B2}$ and $I_{B3}$ is more significant.

In other words, if transistors B and C are not strictly identical, noise immunity of the circuit shown in FIG. 3 can be poor. However, it is possible to ensure the same noise immunity for B and C by an appropriate layout ensuring different rise times for B and C, for instance, to make C faster than B. Then, the noise immunity of B increases when D is off but decreases when D is on (which is not detrimental since there is a good safety margin in this case). Simulation has shown that it is sufficient to add a capacitance of 0.2 pf on the base of B. The noise immunity of the circuit of FIG. 3 can be improved in several ways: it is possible to make the base of B longer than the base of C (Li), see FIG. 4; it is also possible to modify the injection layout (by decreasing the B base width, see FIG. 4); or two lateral PNP transistors can be used to adjust the noise immunity of B and C, separately.

Figure 6:
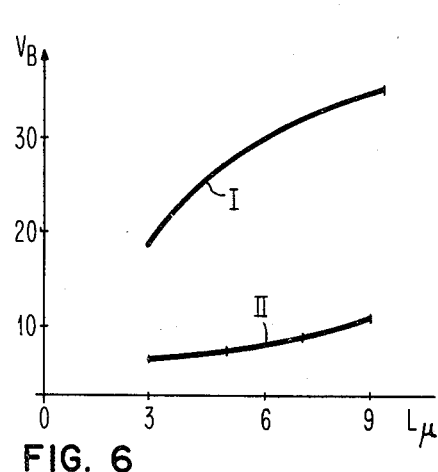
FIG. 6 shows the two noise margin curves in function of critical dimension L of FIG. 4 when device D is on then off.
Figure 7:
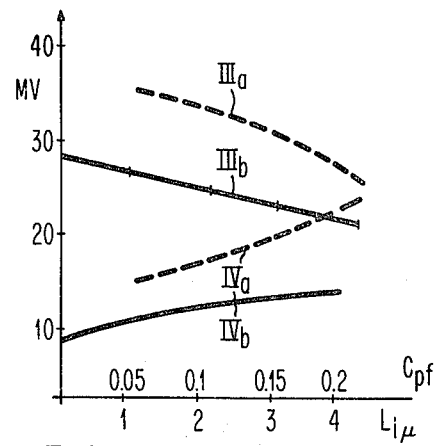
FIG. 7 shows the noise margin curves in function of the capacitance of the base of transistor B and of length Li of FIG. 4.

The noise immunity of two devices is measured by using the noise margin or the difference between the operating threshold voltages of said two devices. The greatest is the margin, the greatest is the noise immunity. FIG. 6 shows noise margin $V_B$ in mV in function of L for the cases in which transistor D is on (curve I) and off (curve II). The sensitivity of the noise margin with respect to the capacitance is shown in FIG. 7 for the two above indicated cases (curves IIIa and IVa). The sensitivity of the noise margin with respect to Li is also shown in FIG. 7 (curves IIIb and IVb).

Figure 5:
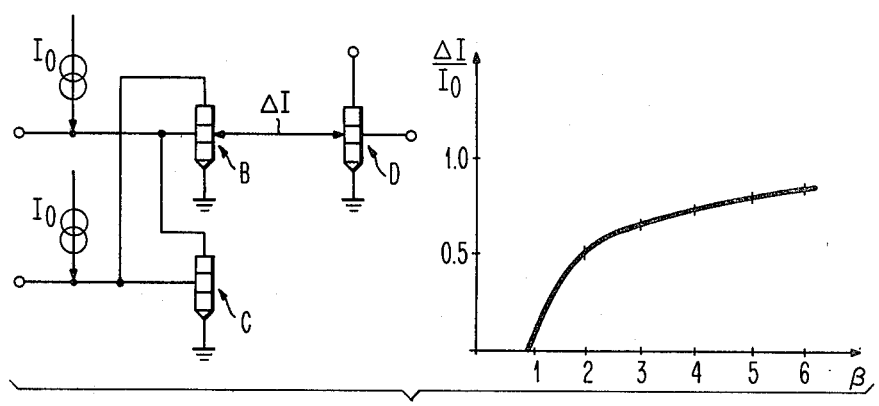
FIG. 5 shows the transfer factor in function of efficient gain $\beta$ of the NPN transistor in the circuit of FIG. 3.

Another problem is set by the estimation of the stability. In this case, it is necessary for the coupling current added to the injection current, not to modify the operation (the state) of the flip-flop when it appears alone. In other words, the coupling must be sufficient to differentiate the operations of transistors B and C, without modifying alone the state of the flip-flop, so that said flip-flop does not being to oscillate. The transistor effect of the PNP device must not be too efficient. FIG. 5 is a diagram of the circuit shown in FIG. 3. If $\beta$ is the efficient gain of transistor D which will be defined later, stability is ensured when:

$$(Io - \Delta I) \cdot \beta > Io, \text{ i.e. } \Delta I/Io > \beta - 1/\beta$$

where $\Delta I/Io$ is the transfer ratio which is shown as a function of $\beta$ on the curve of FIG. 5.

Gain $\beta$ is defined as the ratio of the collector current with respect to the current injected into the injector base.

$\Delta I$ is proportional to L while Io is proportional to Lo. Therefore, these two parameters can be modified to stabilize the system.

If W is the distance between the bases of devices B and D, $\Delta I$ is proportional to L/W. In the same way, Io is proportional to Lo/Wo if Wo is the distance between the injector and the base of device D.

Then, one has:

$$\Delta I/Io = (L \times Wo)/(W \times Lo)$$

Relation $\Delta I/Io < \beta - 1/\beta$ can be transformed into:

$$L < (W \times Lo)/Wo \cdot \beta - 1/\beta.$$

Generalization

The principles of this invention can be applied in a plurality of synchronous logic circuits. Two different embodiments are described: the first one relates to T flip-flops; the second one relates to static shift registers.

(I) T Flip-flop

This type of flip-flop is very widely used, in particular in counters, dividers by two, ..., etc. This flip-flop is achieved by connecting the data input of an Eccles-Jordan flip-flop to complemented output ($\bar{Q}$). Each clock pulse applied to input T of the T flip-flop changes its state. FIG. 8 shows such a MTL flip-flop made up of five MTL devices A, B, C, D and E provided with dual collectors (as A on FIG. 4). The connection between the data input and output ($\bar{Q}$) is achieved by coupling B and E. At least, two of the devices are coupled in accordance with the teaching of this invention: C and D or B and E. But it is possible to couple two pairs of devices if a good noise immunity is desired in the two above indicated cases (transistor D: on or off). The system operates as follows:

Let us assume that the bistable element made up of transistors D and E is such that Q=1 for the high level of the clock signal, which means that D is off and that E is on (B and C being, then, set off by transistor A). When the clock signal goes low, A is off, the potential of the bases of devices B and C increases. Transistor E, which is on, provides coupling current $\Delta I$ to transistor B. Transistor B is set on faster than C (which is coupled to D which is set off). The state of the flip-flop is going to change. B and D are set on. C and E are set off and Q=0. When the next clock pulse rises back to the high level, A is saturated, transistors B and C are off and there is no interaction with transistors D and E. The bistable element made up of transistors D and E remains in the preceding logic state. Therefore, the flip-flop operates as a divider by two.

When this case is compared to a conventional embodiment as the one described more particularly by Richard L. Horton in his article entitled "I²L Takes Bipolar Integration A Significant Step Forward" and published in the review "Electronics" of Feb. 6, 1975, page 83, it appears that five devices are required (instead of seven, taking into account the input device which is not shown) and ten collectors, instead of fifteen.

Therefore, this invention allows the integration density to be significantly increased.

(II) Static Shift Register

Figure 10:
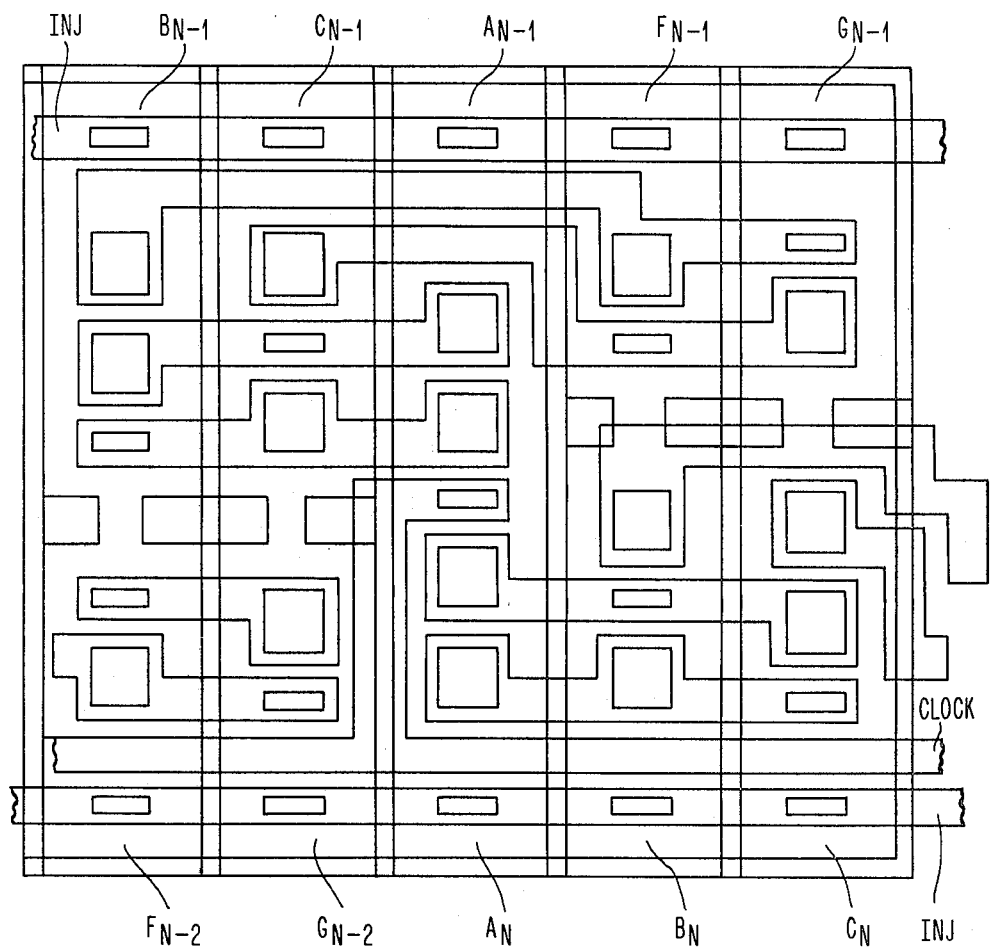
FIG. 10 shows the lay out of the circuit of FIG. 9.

Two successive cells (or stages) $CELL_{N-1}$ and $CELL_N$ of such a register are shown in FIG. 9. The first cell includes an input device $A_{N-1}$ which drives a bistable element made up of devices $B_{N-1}$ and $C_{N-1}$. Device $C_{N-1}$ also receives the data which should flow on its base. Devices $B_{N-1}$ and $C_{N-1}$ which made up the transfer section of cell $CELL_{N-1}$ are associated to the bistable element made up of devices $F_{N-1}$ and $G_{N-1}$ which form the store section. $CELL_N$ is identical to cell $CELL_{N-1}$. The clock drives devices $A_{N-1}$, $A_N$, .... Cells $CELL_{N-1}$ and $CELL_N$ are coupled in accordance with the teaching of this invention as shown in FIG. 9. It can be sufficient to have a single coupling (devices $G_{N-1}$ and $C_N$) or two couplings (by coupling also $F_{N-1}$ and $B_N$). FIG. 10 which partially shows the layout of these cells, also shows that devices $F_{N-1}$ and $B_N$ on the one hand and $G_{N-1}$ and $C_N$ on the other hand, are adjacent to allow coupling to be ensured between the bases through passages provided in the isolation wall (width: 5 to 12 $\mu$m). Thus, in this way, the data which has been transferred to device $F_{N-1}$ on the first clock pulse, is transferred into device $F_N$ on the second clock pulse.

In effect, when the clock signal is high (store function), $A_{N-1}$ is saturated, devices $B_{N-1}$ and $C_{N-1}$ are off, $F_{N-1}$ is on while $G_{N-1}$ is off. Therefore, the base of device $F_{N-1}$ is high when the clock signal is low (transfer function). The base of $A_N$ is set to the low level. The potential increases at the bases of devices $C_N$ and $B_N$, but $F_{N-1}$ injects holes towards $B_N$ which receives more current than $C_N$. Thus, $C_N$ is off while $B_N$ is on. The potential at the collector of device $B_N$ decreases. Therefore, $C_N$ is off while $F_N$ is on. The information has effectively moved from $F_{N-1}$ to $F_N$. Coupling between the data input and device C1 of cell $CELL_1$ can also be ensured by a lateral PNP device in accordance with this invention (not shown). It should be ascertained that the coupling between devices $G_{N-1}$ and $C_N$ is sufficiently low to avoid any change in the state of the flip-flop (the oscillating effect, as seen above, should be avoided to ensure a good stability of the circuit).

It should be noted that two successive devices receiving the clock pulses, for instance $A_{N-1}$ and $A_N$ are integrated in a single device provided with two injectors and four collectors as shown in FIG. 10. It should also be noted that $G_{N-1}$ and $C_N$ on the one hand and $F_{N-1}$ and $B_N$ on the other hand are very close to each other on the silicon substrate. Then, it is sure that they show identical characteristics and a good noise immunity. As compared to the conventional MTL shift registers which require approximately seven devices and thirteen collectors, the approach proposed here, only requires five devices and eight collectors. The surface gain is 30%, approximately. This layout allows up to 100 bits/mm² to be obtained instead of 75 bits/mm². In addition, the speed being direct function of the dimensions of the device base (charging holes between the base diffusion and the subcollector), it is possible to improve the speed by 20%, approximately. At last, the emitter collector leakage appearing as a major defect in MTL technology and detrimentally affecting the manufacturing efficiency, is, in this case, reduced by the reduction of the number of collectors.

Thus, starting from a basic bistable cell as the one shown in FIGS. 3 and 4, made up of two cross-coupled transistors (B and C), the final state of this flip-flop is not determined except when transistors B and C are voluntarily differentiated. A control transistor (D) is associated to this cell to ensure a coupling through PNP transistor effect between its base and the base of one of the two transistors (B) of the cell. This time, this state of the bistable cell depends on the state of the control transistor and therefore, on logic input J. In MTL technology, this coupling is ensured by a passage through the isolation wall between devices B and D.

In another embodiment, the same basic cell (made up of transistors A, B and C) is provided with two cross-coupled devices (D and E) driven by the output of devices C and B and, in addition, coupled by bases C and D on the one hand, and B and E on the other hand. Such a circuit forms a T flip-flop input device A of which receives the clock signal.

Now, if one considers the basic cell provided with a logic input on the base of one of the two devices (C1) of the first cell (not shown) and assumes that input devices ($A_{N-1}$) are driven by the clock signal, this cell forms the transfer section of a shift register cell the storing section of which is made up of two cross-coupled devices ($F_{N-1}$ and $G_{N-1}$) which are respectively driven by devices $C_{N-1}$ and $B_{N-1}$. The shift register is obtained by cross-coupling input devices $B_N$ and $C_N$ of cell N to devices $F_{N-1}$ and $C_{N-1}$, respectively, of the storing section.

Other applications are possible from the basic cell.

While the invention has been particularly shown and described with reference to a preferred embodiment thereof, it will be understood by those skilled in the art that numerous changes in form and detail may be made therein without departing from the spirit and scope of the invention.

I claim:

1. A bistable device having first and second stable states and control means for causing said bistable device to preferentially assume said second state, said bistable device and control means comprising:

a first I²L circuit having a data input and first and second outputs;

a second I²L circuit having an input and an output;

a third I²L circuit having an input and an output;
a fourth I²L circuit having at least a control input;
first passive connection means for connecting in common said first output of said first I²L circuit, said input of said second I²L circuit and said output of said third I²L circuit;
second passive connection means for connecting in common said second output of said first I²L circuit, said input of said third I²L circuit and said output of said second I²L circuit; and
solid state circuit means coupling said fourth I²L circuit means to said second I²L circuit.

2. A bistable device having first and second stable states and control means for causing said bistable device to preferentially assume said second state, as recited in claim 1, wherein said solid state circuit means consists of a PNP transistor.

3. A bistable device having first and second stable states and control means for causing said bistable device to preferentially assume said second state, as recited in claim 2, wherein said second I²L circuit includes an NPN transistor, said fourth I²L circuit includes at least the emitter and base of an NPN transistor and wherein said PNP transistor of said solid state circuit means is integrally formed with said NPN of said second I²L circuit and said emitter and base of said NPN transistor of said fourth I²L circuit.

4. A solid-state bistable device having a first stable state and a preferred second stable state, said bistable device being formed in the surface of a substrate of monolithic semiconductor material, said solid-state bistable device comprising:
a first I²L circuit contained within an electrically isolated first region of said monolithic semiconductor material, said first I²L circuit having a data input and first and second outputs;
a second I²L circuit contained within an electrically isolated second region of said monolithic semiconductor material, said second I²L circuit having an input and output;
a third I²L circuit contained within an electrically isolated third region of said monolithic semiconductor material, said third I²L circuit having an input and an output;
a fourth I²L circuit contained within said electrically isolated third region of said monolithic semiconductor material, said fourth I²L circuit having at least a control input;
an isolation wall having a precisely positioned discontinuity therein and contained within said third electrically isolated region of monolithic semiconductor material, said isolation wall separating said third isolation region of said monolithic semiconductor material into a first portion containing said third I²L circuit and a second portion containing said fourth I²L circuit;
said third region of monolithic semiconductor material including a third portion of monolithic semiconductor material, said third portion of monolithic semiconductor material extending through said precisely positioned discontinuity in said isolation wall and being integrally formed with and extending from said first portion of said third region of monolithic semiconductor material to said second portion of said third region of monolithic semiconductor material;
first passive connection means for connecting in common said first output of said first I²L circuit, said input of said third I²L circuit and said output of said second I²L circuit;
second passive connection means for connecting in common said second output of said first I²L circuit, said input of said second I²L circuit and said output of said third I²L circuit; and
solid state circuit means formed in said third portion of said third region of monolithic semiconductor material, said solid state circuit means comprising a bipolar transistor coupling said third I²L circuit to said fourth I²L circuit.

5. A solid-state bistable device having a first stable state and a preferred second stable state, as recited in claim 4, wherein said solid state circuit means formed in said third portion of said third region of monolithic semiconductor material consists of a PNP transistor integrally formed in monolithic semiconductor material with said third I²L circuit and said fourth I²L circuit.

6. A solid-state bistable device having a first stable state and a preferred second stable state, as recited in claim 4, wherein:
said first I²L circuit comprising a first NPN transistor having an emitter, base and first and second collectors, said base of said first NPN transistor serving as said data input of said first I²L circuit, said first and second collectors of said first NPN transistor respectively serving as said first and second outputs of said first I²L circuit and a first current source connected to said base of said first NPN transistor of said first I²L circuit, said first current source providing a constant current Io;
said second I²L circuit comprising a second NPN transistor having an emitter, base and collector, said base of said second NPN transistor serving as said input of said second I²L circuit, said collector of said second NPN transistor serving as said output of said second I²L circuit and a second current source connected to said base of said second NPN transistor of said second I²L circuit, said second current source providing a constant current $I_o$;
said third I²L circuit comprising a third NPN transistor having an emitter, base and collector, said base of said third NPN transistor serving as said input of said third I²L circuit, said collector of said third NPN transistor serving as said output of said third I²L circuit and a third current source connected to said base of said third NPN transistor of said third I²L circuit, said third current source providing a constant current $I_o$;
said fourth I²L circuit comprising a fourth NPN transistor having at least an emitter and base, said base of said fourth NPN transistor serving as the control input of said fourth I²L circuit and a fourth current source connected to said base of said fourth NPN transistor, said fourth current source providing a constant current $I_o$; and
said solid state circuit means formed in said third portion of said third region of monolithic semiconductor material consists of a PNP transistor integrally formed in said monolithic semiconductor material with said third I²L circuit and said fourth I²L circuit.

7. A solid-state bistable device having a first stable state and a preferred second stable state, as recited in claim 6, wherein the emitter of said PNP transistor and the base of said third NPN transistor of said third I²L circuit occupy essentially the same volume of monolithic semiconductor material and the collector of said PNP transistor and the base of said fourth NPN transistor of said fourth I²L circuit occupy essentially the same volume of monolithic semiconductor material.

8. A solid-state bistable device having a first stable state and a preferred second stable state, as recited in claim 6, wherein the collector of said PNP transistor and the base of said third NPN transistor of said third I²L circuit occupy essentially the same volume of monolithic semiconductor material and the emitter of said PNP transistor and the base of said fourth NPN transistor of said fourth I²L circuit occupy essentially the same volume of monolithic semiconductor material.

9. A solid-state bistable device having a first stable state and a preferred second stable state, as recited in claim 7 or claim 8 wherein:
said first current source of said first I²L circuit consists essentially of a PNP transistor having its collector connected to the base of said first NPN transistor of said first I²L circuit;
said second current source of said second I²L circuit consists essentially of a PNP transistor having its collector connected to the base of said second NPN transistor of said second I²L circuit;
said third current source of said third I²L circuit consists essentially of a PNP transistor having its collector connected to the base of said third NPN transistor of said third I²L circuit; and
said fourth current source of said fourth I²L circuit consists essentially of a PNP transistor having its collector connected to the base of said fourth NPN of said fourth I²L circuit.

10. A solid-state T flip-flop device having first and second stable states, said solid-state T flip-flop device including:
a first I²L circuit means having a clock input and first and second outputs;
a second I²L circuit means having an input and first and second outputs;
a third I²L circuit means having an input and first and second outputs;
a fourth I²L circuit means having an input and at least a first output;
a fifth I²L circuit means having an input and at least a first output;
first passive connection means for connecting in common said first output of said first I²L circuit means, said first output of said third I²L circuit means and said input of said second I²L circuit means;
second passive connection means for connecting in common said second output of said first I²L circuit means, said first output of said second I²L circuit means and said input of said third I²L circuit means;
third passive connection means for connecting in common said second output of said second I²L circuit means, said first output of said fifth I²L circuit means and said input of said fourth I²L circuit means;
fourth passive connection means for connecting in common said second output of said third I²L circuit means, said first output of said fourth I²L circuit means and said input of said fifth I²L circuit means; and
solid-state circuit means coupling said fifth I²L circuit means to said third I²L circuit means.

11. A solid-state T flip-flop device having first and second stable states, as recited in claim 10, wherein said solid-state circuit means consists of a PNP transistor integrally formed with said fifth I²L circuit means and said third I²L circuit means.

12. A solid-state T flip-flop device having first and second stable states, as recited in claim 10, wherein said solid state circuit means couples said fifth I²L circuit means to said third I²L circuit means and also couples said fourth I²L circuit means to said second I²L circuit means.

13. A solid-state T flip-flop device having first and second stable states, as recited in claim 12, wherein said solid-state circuit means consists of:
a first PNP transistor coupling said fifth I²L circuit means to said third I²L circuit means, said first PNP transistor being integrally formed with said fifth I²L circuit means and said third I²L circuit means; and
a second PNP transistor coupling said fourth I²L circuit means to said second I²L circuit means, said second PNP transistor being integrally formed with said I²L circuit means and said second I²L circuit means.

14. A solid-state T flip-flop device having first and second stable states of conductivity, said solid-state T flip-flop device being formed in the surface of a substrate of monolithic semiconductor material, said solid-state T flip-flop device including:
first I²L circuit means contained within an electrically isolated first region of said monolithic semiconductor material, said first I²L circuit means having a clock input and first and second outputs;
second I²L circuit means contained within an electrically isolated second region of said monolithic semiconductor material, said second I²L circuit means having an input and first and second outputs;
third I²L circuit means contained within an electrically isolated third region of said monolithic semiconductor material, said third I²L circuit means including an input and first and second outputs;
fourth I²L circuit means contained within an electrically isolated fourth region of said monolithic semiconductor material, said fourth I²L circuit means having an input and first and second outputs;
fifth I²L circuit means contained within said electrically isolated third region of monolithic semiconductor material, said fifth I²L circuit means having an input and first and second outputs;
an isolation wall having a precisely positioned opening therein and contained within said third electrically isolated region of monolithic semiconductor material, said isolation wall separating said third electrically isolated region into a first portion containing said third I²L circuit means and a second portion containing said fifth I²L circuit means;
said third region of monolithic semiconductor material including a third portion of monolithic semiconductor material, said third portion of monolithic semiconductor material extending through said opening in said isolation wall and being integrally formed with and extending from said first portion of said third region of monolithic semiconductor material to said second portion of said third region of monolithic semiconductor material;
first passive connection means for connecting in common said first output of said first I²L circuit means, said input of said second I²L circuit means and said first output of said third I²L circuit means;
second passive connection means for connecting in common said second output of said first I²L circuit means, said input of said third I²L circuit means and said first output of said second I²L circuit means;
third passive connection means for connecting in common said second output of said second I²L circuit means, said input of said fourth I²L circuit means and said first output of said fifth I²L circuit means;

fourth passive connection means for connecting in common said second output of said third I²L circuit means, said input of said fifth I²L circuit means and said first output of said fourth I²L circuit means; and solid-state circuit means formed in said third portion of said third region of monolithic semiconductor material, said solid state circuit means comprising a bipolar transistor coupling said third I²L circuit means to said fifth I²L circuit means.

15. A solid-state T flip-flop device having first and second stable states of conductivity, as recited in claim 14, wherein said solid-state circuit means formed in said third portion of monolithic semiconductor material consists of a PNP transistor integrally formed in said monolithic semiconductor material with said third I²L circuit means and said fifth I²L circuit means.

16. A solid-state T flip-flop device having first and second stable states of conductivity, as recited in claim 14, wherein:

said first I²L circuit means comprising a first NPN transistor having an emitter, base and first and second collectors, said base of said first NPN transistor serving as said clock input of said first I²L circuit means, said first and second collectors of said first NPN transistor of said first I²L circuit means respectively serving as said first and second outputs of said first I²L circuit means and a first current source connected to said base of said first NPN transistor of said first I²L circuit means, said first current source providing a constant current $I_o$;

said second I²L circuit means comprising a second NPN transistor having an emitter, base and first and second collectors, said base of said second NPN transistor serving as said input of said second I²L circuit means, said first and second collectors of said second NPN transistor of said second I²L circuit means respectively serving as said first and second outputs of said second I²L circuit means and a second current source connected to said base of said second NPN transistor of said second I²L circuit means, said second current source providing a constant current $I_o$;

said third I²L circuit means comprising a third NPN transistor having an emitter, base and first and second collectors, said base of said third NPN transistor serving as said input of said third I²L circuit means, said first and second collectors of said third NPN transistor of said third I²L circuit means respectively serving as said first and second outputs of said third I²L circuit means, and a third current source connected to said base of said third NPN transistor of said third I²L circuit means, said third current source providing a constant current $I_o$;

said fourth I²L circuit means comprising a fourth NPN transistor having an emitter, base and first and second collectors, said base of said fourth NPN transistor serving as said input of said fourth I²L circuit means, said first and second collectors of said fourth NPN transistor of said fourth I²L circuit means respectively serving as said first and second outputs of said fourth I²L circuit means, and a fourth current source connected to said base of said fourth NPN transistor of said fourth I²L circuit means, said fourth current source providing a constant current $I_o$;

said fifth I²L circuit means comprising a fifth NPN transistor having an emitter, base and first and second collectors, said base of said fifth NPN transistor of said fifth I²L circuit means serving as the input of said fifth I²L circuit means, said first and second collectors of said fifth NPN transistor of said fifth I²L circuit means respectively serving as said first and second outputs of said fifth I²L circuit means and a fifth current source connected to said base of said fifth NPN transistor of said fifth I²L circuit means, said fifth current source providing a constant current $I_o$; and said solid state circuit means formed in said third portion of said third region of monolithic semiconductor material consists of a PNP transistor integrally formed in said monolithic semiconductor material with said third I²L circuit means and said fifth I²L circuit means.

17. A solid-state T flip-flop device having first and second stable states of conductivity, as recited in claim 16, wherein the emitter of said PNP transistor and the base of said NPN transistor of said third I²L circuit means occupy essentially a same volume of monolithic semiconductor material and the collector of said NPN transistor and the base of said fifth NPN transistor of said fifth I²L circuit means occupy essentially a same volume of monolithic semiconductor material.

18. A solid-state T flip-flop device having first and second stable states of conductivity, as recited in claim 16, wherein the collector of said PNP transistor and the base of said NPN transistor of said third I²L circuit means occupy essentially a same volume of monolithic semiconductor material and the emitter of said PNP transistor and the base of said fifth NPN transistor of said fifth I²L circuit means occupy essentially a same volume of monolithic semiconductor material.

19. A solid-state T flip-flop device having first and second stable states of conductivity, as recited in claim 17, or claim 18, wherein:

said first current source of said first I²L circuit means consists essentially of a PNP transistor having its collector connected to the base of said first NPN transistor of said first I²L circuit means;

said second current source of said second I²L circuit means consists essentially of a PNP transistor having its collector connected to the base of said NPN transistor of said second I²L circuit means;

said third current source of said third I²L circuit means consists essentially of a PNP transistor having its collector connected to the base of said third NPN transistor of said third I²L circuit means;

said fourth current source of said fourth I²L circuit means consists essentially of a PNP transistor having its collector connected to the base of said fourth NPN transistor of said fourth I²L circuit means; and said fifth current source of said fifth I²L circuit means consists essentially of a PNP transistor having its collector connected to the base of said fifth NPN transistor of said fifth I²L circuit means.

20. A solid-state T flip-flop device having first and second stable states of conductivity, said solid-state T flip-flop device being formed in the surface of a substrate of monolithic semiconductor material, said solid-state T flip-flop device including:

first I²L circuit means contained within an electrically isolated first region of said monolithic semiconductor material, said first I²L circuit means having a clock input and first and second outputs;

second I²L circuit means contained within an electrically isolated second region of said monolithic semiconductor material, said second I²L circuit means having an input and first and second outputs;

third I²L circuit means contained within an electrically isolated third region of said monolithic semiconductor material, said third I²L circuit means having an input and first and second outputs;

fourth I²L circuit means contained within said electrically isolated second region of said monolithic semiconductor material, said fourth I²L circuit means having an input and first and second outputs;

fifth I²L circuit means contained within said electrically isolated third region of said monolithic semiconductor material, said fifth I²L circuit means having an input and first and second outputs;

a first isolation wall having a precisely positioned opening therein and contained within said second electrically isolated region of monolithic semiconductor material, said first isolation wall essentially separating said second electrically isolated region of monolithic semiconductor material into a first position containing said second I²L circuit means and a second portion containing said fourth I²L circuit means;

said second region of monolithic semiconductor material including a third portion of monolithic semiconductor material, said third portion of monolithic semiconductor material extending through said precisely positioned opening in said first isolation wall and being integrally formed with and extending from said first portion of said second region of monolithic semiconductor material to said second portion of said second region of monolithic semiconductor material;

a second isolation wall having a precisely positioned opening therein and contained within said third electrically isolated region of monolithic semiconductor material, said second isolation wall essentially separating said third electrically isolated region of monolithic semiconductor material into a fourth portion containing said third I²L circuit means and a fifth portion containing said fifth I²L circuit means;

said third region of monolithic semiconductor material including a sixth portion of monolithic semiconductor material, said sixth portion of monolithic semiconductor material extending through said precisely positioned opening in said second isolation wall and being integrally formed with and extending from said fourth portion of said third region of monolithic semiconductor material to said fifth portion of said third region of monolithic semiconductor material;

first passive connection means for connecting in common said first output of said first I²L circuit means, said input of said second I²L circuit means, and said first output of said third I²L circuit means;

second passive connection means for connecting in common said second output of said first I²L circuit means, said input of said third I²L circuit means and said first output of said second I²L circuit means;

third passive connection means for connecting in common said second output of said second I²L circuit means, said input of said fourth I²L circuit means and said first output of said fifth I²L circuit means;

fourth passive connection means for connecting in common said second output of said third I²L circuit means, said input of said fifth circuit means and said first output of said fourth circuit means;

first solid-state circuit means formed in said third portion of monolithic semiconductor material, said first solid state circuit means comprising a first bipolar transistor, said first bipolar transistor coupling said second I²L circuit means to said fourth I²L circuit means; and second solid-state circuit means formed in said sixth portion of monolithic semiconductor material, said second solid-state circuit means comprising a second bipolar transistor, said second bipolar transistor coupling said third I²L circuit means to said fifth I²L circuit means.

21. A solid-state T flip-flop device having first and second stable states of conductivity, as recited in claim 20, wherein:

said first solid-state circuit means formed in said third portion of said second region of monolithic semiconductor material consists of a first PNP transistor integrally formed in said monolithic semiconductor material with said second I²L circuit means and said fourth I²L circuit means; and said second solid-state circuit means formed in said sixth portion of said third region of monolithic semiconductor material consists of a second PNP transistor integrally formed in said monolithic semiconductor material with said third I²L circuit means and said fifth I²L circuit means.

22. A solid-state T flip-flop device having first and second stable states of conductivity, as recited in claim 20, wherein:

said first I²L circuit means comprises a first NPN transistor having an emitter, base and first and second collectors, said base of said first NPN transistor of said first I²L circuit means serving as said clock input of said first I²L circuit means, said first and second collectors of said first NPN transistor of said first I²L circuit means respectively serving as said first and second outputs of said first I²L circuit means and a first current source connected to said base of said first NPN transistor of said first I²L circuit means, said first current source providing a constant current $I_o$;

said second I²L circuit means comprises a second NPN transistor having an emitter base and first and second collectors, said base of said second NPN transistor of said second I²L circuit means serving as said input of said second I²L circuit means, said first and second collectors of said second NPN transistor of said second I²L circuit means respectively serving as said first and second outputs of said second I²L circuit means and a second current source connected to said base of said second NPN transistor of said second I²L circuit means, said second current source providing a constant current $I_o$;

said third I²L circuit means comprises a third NPN transistor having an emitter, base and first and second collectors, said base of said third NPN transistor of said third I²L circuit means serving as said input of said third I²L circuit means, said first and second collectors of said third NPN transistor of said third I²L circuit means respectively serving as said first and second outputs of said third I²L circuit means, and a third current source connected to said base of said third NPN transistor of said third I²L circuit means, said third current source providing a constant current $I_o$;

said fourth I²L circuit means comprises a fourth NPN transistor having an emitter, base and first and second collectors, said base of said fourth NPN transistor of said fourth I²L circuit means serving as said input of said fourth I²L circuit means, said first and second collectors of said fourth NPN transistor of said fourth I²L circuit means respectively serving as said first and second outputs of said fourth I²L circuit means, and a fourth current source connected to said base of said fourth NPN transistor of said fourth I²L circuit means, said fourth current source providing a constant current $I_o$;

said fifth I²L circuit means comprises a fifth NPN transistor having an emitter, base and first and second collectors, said base of said fifth NPN transistor of said fifth I²L circuit means serving as the input of said fifth I²L circuit means, said first and second collectors of said fifth NPN transistor of said fifth I²L circuit means respectively serving as said first and second outputs of said fifth I²L circuit means and a fifth current source connected to said base of said fifth NPN transistor of said fifth I²L circuit means, said fifth current source providing a constant current I;

said first solid-state circuit means formed in said third portion of said second region of monolithic semiconductor material consists of a first PNP transistor integrally formed in said monolithic semiconductor material with said second I²L circuit means and said fourth I²L circuit means; and said second solid-state circuit means formed in said sixth portion of said third region of monolithic semiconductor material consists of a second PNP transistor integrally formed in said monolithic semiconductor material with said third I²L circuit means and said fifth I²L circuit means.

23. A solid-state T flip-flop device having first and second stable states of conductivity, as recited in claim 22, wherein the emitter of said first PNP transistor and the base of said second NPN transistor of said second I²L circuit means occupy essentially a same volume of monolithic semiconductor material and the collector of said first PNP transistor and the base of said fourth NPN transistor of said fourth I²L circuit means occupy essentially a same volume of monolithic semiconductor material.

24. A solid-state T flip-flop device having first and second stable states of conductivity, as recited in claim 22, wherein the collector of said first PNP transistor and the base of said second NPN transistor of said second I²L circuit means occupy essentially a same volume of monolithic semiconductor material and the emitter of said first PNP transistor and the base of said fourth NPN transistor of said fourth I²L circuit means occupy essentially a same volume of monolithic semiconductor material.

25. A solid-state T flip-flop device having first and second stable states of conductivity, as recited in claim 22, wherein the emitter of said second PNP transistor and the base of said third NPN transistor of third I²L circuit means occupy essentially a same volume of monolithic semiconductor material and the collector of said second PNP transistor and the base of said fifth NPN transistor of said fifth I²L circuit means occupy essentially a same volume of monolithic semiconductor material.

26. A solid-state T flip-flop device having first and second stable states of conductivity, as recited in claim 22, wherein the collector of said second PNP transistor and the base of said third NPN transistor of said third I²L circuit means occupy essentially a same volume of monolithic semiconductor material and the emitter of said second PNP transistor and the base of said fifth NPN transistor of said fifth I²L circuit means occupy essentially a same volume of monolithic semiconductor material.

27. A solid-state T flip-flop device having first and second stable states of conductivity, as recited in claim 23, 24, 25 or 26, wherein:

said first current source of said first I²L circuit means consists essentially of a PNP transistor having its collector connected to the base of said first NPN transistor of said first I²L circuit means;

said second current source of said second I²L circuit means consists essentially of a PNP transistor having its collector connected to the base of said second NPN transistor of said second I²L circuit means;

said third current source of said third I²L circuit means consists essentially of a PNP transistor having its collector connected to the base of said third NPN transistor of said third I²L circuit means;

said fourth current source of said fourth I²L circuit means consists essentially of a PNP transistor having its collector connected to the base of said fourth NPN transistor of said fourth I²L circuit means; and said fifth current source of said fifth I²L circuit means consists essentially of a PNP transistor having its collector connected to the base of said fifth NPN transistor of said fifth I²L circuit means.

28. In a solid-state I²L static shift register having at least first, second and third I²L shift register stages, said solid-state I²L static shift register including first coupling means for coupling said first stage to said second stage and second coupling means for coupling said second stage to said third stage, each of said solid-state I²L static shift register stages comprising:

first I²L circuit means including an input for receiving a clock signal and first and second outputs;

second I²L circuit means including an input and first and second outputs;

third I² L circuit means including an input and first and second outputs;

fourth I²L circuit means including an input and an output;

fifth I²L circuit means including an input and an output;

first passive connection means for connecting in common said first output of said first I²L circuit means, said input of said second I²L circuit means and said first output of said third I²L circuit means;

second passive connection means for connecting in common said second output of said first I²L circuit means, said input of said third I²L circuit means and said first output of said second I²L circuit means;

third passive connection means for connecting in common said second output of said second I²L circuit means, said input of said fourth I²L circuit means and said output of said fifth I²L circuit means;

fourth passive connection means for connecting in common said second output of said third I²L circuit means, said input of said fifth I²L circuit means and said output of said fourth I²L circuit means;

said first coupling means comprising solid-state circuit means coupling said fifth I²L circuit means of said first I²L static-shift register stage to said second I²L circuit means of said second I²L static-shift register stage; and said second coupling means comprising solid-state circuit means coupling said fifth I²L circuit means of said second I²L static-shift register stage to said second I²L circuit means of said third I²L static-shift register stage.

29. In a solid-state I²L static-shift register having at least first, second and third I²L shift register stages, said solid-state I²L static-shift register including first coupling means for coupling said first stage to said second stage and second coupling means for coupling second stage to said third stage, as recited in claim 28, wherein:

said solid-state circuit means of said first coupling means comprises a bipolar transistor; and said solid state circuit means of said second coupling means comprises a bipolar transistor.

30. In a solid-state I²L static shift register having at least first, second, and third I²L shift register stages, said solid-state I²L static shift register including first coupling means for coupling said first stage to said second stage and second coupling means for coupling said second stage to said third stage, as recited in claim 29, wherein:

said solid-state circuit means of said first coupling means consists of a PNP transistor integrally formed with said fifth I²L circuit means of said first I²L static shift register stage and said second I²L circuit means of said second I²L static shift register stage; and said solid-state circuit means of said second coupling means consists of a PNP transistor integrally formed with said fifth I²L circuit means of said second I²L static shift register stage and said second IL circuit means of said third I²L static shift register stage.

31. In a solid-state I²L static shift register having at least first, second and third I²L static shift register stages, said solid-state I²L static shift register including first coupling means for coupling said first stage to said second stage and second coupling means for coupling said second stage to said third stage, as recited in claim 30, wherein:

said first I²L circuit means comprises a first NPN transistor having an emitter, base and first and second collectors, said base of said first NPN transistor serving as said clock signal input of said first I²L circuit means, said first and second collectors of said first NPN transistor respectively serving as said first and second outputs of said first I²L circuit means and a first current source connected to said base of said first NPN transistor of said first I²L circuit means, said first current source providing a constant current $I_o$;

said second I²L circuit means comprises a second NPN transistor having an emitter, base and first and second collectors, said base of said second NPN transistor serving as said input of said second I²L circuit means, said first and second collectors of said second NPN transistor respectively serving as said first and second outputs of said second I²L circuit means and a second current source connected to said base of said second NPN transistor of said second I²L circuit means, said second current source providing a constant current $I_o$;

said third I²L circuit means comprises a third NPN transistor having an emitter, base and first and second collectors, said base of said third NPN transistor serving as said input of said third I²L circuit means, said first and second collectors of said third NPN transistor respectively serving as said first and second outputs of said third I²L circuit means and a third current source connected to said base of said third NPN transistor of said third I²L circuit means, said third current source providing a constant current $I_o$;

said fourth I²L circuit means comprises a fourth NPN transistor having an emitter, base and a collector, said base of said fourth NPN transistor serving as said input of said fourth I²L circuit means, said collector of said fourth NPN transistor serving as the output of said fourth I²L circuit means and a fourth current source connected to said base of said fourth NPN transistor of said fourth I²L circuit means, said fourth current source providing a constant current of $I_o$; and said fifth I²L circuit means comprises a fifth NPN transistor having an emitter, base and a collector, said base of said fifth NPN transistor serving as said input of said fifth I²L circuit means, said collector of said fifth NPN transistor serving as said output of said fifth I²L circuit means and a fifth current source connected to said base of said fifth NPN transistor of said fifth I²L circuit means, said fifth current source providing a constant current $I_o$.

32. In a solid-state IL static shift register having at least first, second and third I²L static shift register stages, said solid-state I²L static shift register including first coupling means for coupling said first stage to said second stage and second coupling means for coupling said second stage to said third stage, as recited in claim 31, wherein said emitter of said PNP transistor of said first coupling means is integral with said base of said fifth NPN transistor of said fifth I²L circuit means of said first I²L static shift register stage and said collector of said PNP transistor of said first coupling means is integral with said base of said second NPN transistor of said second I²L circuit means of said second I²L static shift register stage.

33. In a solid-state I²L static shift register having at least first, second and third I²L static shift register stages, said solid-state I²L static shift register including first coupling means for coupling said first stage to said second stage and second coupling means for coupling said second stage to said third stage, as recited in claim 31, wherein said collector of said PNP transistor of said first coupling means is integral with said base of said fifth NPN transistor of said fifth I²L circuit means of said first I²L static shift register stage and said emitter of said PNP transistor of said first coupling means is integral with said base of said second NPN transistor of said second I²L circuit means of said second I²L static shift register stage.

34. In a solid-state I²L static shift register having at least first, second and third I²L static shift register stages, said solid-state I²L static shift register including first coupling means for coupling said first stage to said second stage and second coupling means for coupling said second stage to said third stage, as recited in claim 31, wherein said emitter of said PNP transistor of said second coupling means is integral with said base of said fifth NPN transistor of said fifth I²L circuit means of said second I²L static shift register stage and said collector of said PNP transistor of said second coupling means is integral with said base of said second NPN transistor of said second I²L circuit means of said third I²L static shift register stage.

35. In a solid-state I²L static shift register having at least first, second and third I²L static shift register stages, said solid-state I²L static shift register including first coupling means for coupling said first stage to said second stage and second coupling means for coupling said second stage to said third stage, as recited in claim 31, wherein said collector of said PNP transistor of said second coupling means is integral with said base of said fifth NPN transistor of said fifth I²L circuit means of said second I²L static shift register stage and said emitter of said PNP transistor of said second coupling means is integral with said base of said second NPN transistor of said second I²L circuit means of said third I²L static shift register stage.

36. In a solid-state I²L static shift register having at least first, second, and third I²L static shift register stages, said solid-state I²L static shift register including first coupling means for coupling said first stage to said second stage and second coupling means for coupling said second stage to said third stage, as recited in claim 32, 33, 34, or 35, wherein:
said first current source of said first I²L circuit means consists essentially of a PNP transistor having its collector connected to the base of said first NPN transistor of said first I²L circuit means;
said second current source of said second I²L circuit means consists essentially of a PNP transistor having its collector connected to the base of said second NPN transistor of said second I²L circuit means;
said third current source of said third I²L circuit means consists essentially of a PNP transistor having its collector connected to the base of said third NPN transistor of said third I²L circuit means;
said fourth current source of said fourth I²L circuit means consists essentially of a PNP transistor having its collector connected to the base of said fourth NPN transistor of said fourth I²L circuit means; and
said fifth current source of said fifth I²L circuit means consists essentially of a PNP transistor having its collector connected to the base of said fifth NPN transistor of said fifth I²L circuit means.

37. In a solid-state I²L static shift register having at least first, second and third I²L shift register stages, said solid-state I²L static shift register including first coupling means for coupling said first stage to said second stage and second coupling means for coupling said second stage to said third stage, each of said solid-state I²L static shift register stages comprising:
first I²L circuit means including an input for receiving a clock signal and first and second outputs;
second I²L circuit means including an input and first and second outputs;
third I²L circuit means including an input and first and second outputs;
fourth I²L circuit means including an input and an output;
fifth I²L circuit means including an input and an output;
first passive connection means for connecting in common said first output of said first I²L circuit means, said input of said second I²L circuit means and said first output of said third I²L circuit means;
second passive connection means for connecting in common said second output of said first I²L circuit means, said input of said third I²L circuit means and said first output of said second I²L circuit means;
third passive connection means for connecting in common said second output of said second I²L circuit means, said input of said fourth I²L circuit means and said output of said fifth I²L circuit means;
fourth passive connection means for connecting in common said second output of said third I²L circuit means, said input of said fifth I²L circuit means and said output of said fourth I²L circuit means;
said first coupling means comprising first solid-state circuit means coupling said fourth I²L circuit means of said first I²L static shift register stage to said third I²L circuit means of said second I²L static shift register stage and said second solid-state circuit means coupling said fifth I²L circuit means of said first I²L static shift register stage to said second I²L circuit means of said second I²L static shift register stage; and
said second coupling means comprising third solid-state circuit means coupling said fourth I²L circuit means of said second I²L static shift register stage to said third I²L circuit means of said third I²L static shift register stage and fourth solid-state circuit means coupling said fifth I²L circuit means of said second I²L static shift register stage to said second I²L circuit means of said third I²L static shift register stage.

38. In a solid-state I²L static shift register having at least first, second and third I²L shift register stages, said solid-state I²L static shift register including first coupling means for coupling said first stage to second stage and second coupling means for coupling said second stage to said third stage, as recited in claim 37 wherein:
said first solid-state circuit means of said first coupling means comprises a bipolar transistor;
said second solid-state circuit means of said first coupling means comprises a bipolar transistor;
said third solid-state circuit means of said second coupling means comprises a bipolar transistor; and
said fourth solid-state circuit means of said second coupling means comprises a bipolar transistor.

39. In a solid-state I²L static shift register having at least first, second and third I²L shift register stages, said solid-state I²L static shift register including first coupling means for coupling said first stage to said second stage and second coupling means for coupling said second stage to said third stage, as recited in claim 38, wherein:
said first solid-state circuit means of said first coupling means consists of a PNP transistor integrally formed with said fourth I²L circuit means of said first I²L static shift register stage and said third I²L circuit means of said second I²L static shift register stage;
said second solid-state circuit means of said first coupling means consists of a PNP transistor integrally formed with said fifth I²L circuit means of said first I²L static shift register stage and said second I²L circuit means of said second I²L static shift register stage;
said third solid-state circuit means of said second coupling means consists of a PNP transistor integrally formed with said fourth I²L circuit means of said second I²L static shift register stage and said third I²L circuit means of said third I²L static shift register stage; and
said fourth solid-state circuit means of said second coupling means consists of a PNP transistor integrally formed with said fifth I²L circuit means of said second I²L static shift register stage and said second I²L circuit means of said third I²L static shift register stage.

40. In a solid-state I²L static shift register having at least first, second and third I²L static shift register stages, said solid-state I²L static shift register including first coupling means for coupling said first stage to said second stage and second coupling means for coupling said second stage to said third stage, as recited in claim 39, wherein:
said first I²L circuit means comprises a first NPN transistor having an emitter, base and first and second collectors, said base of said first NPN transistor serving as said clock signal input of said first I²L circuit means, said first and second collectors of said first NPN transistor respectively serving as said first and second outputs of said first I²L circuit means and a first current source connected to said base of said first NPN transistor of said first I²L circuit means, said first current source providing a constant current $I_o$;

said second I²L circuit means comprises a second NPN transistor having an emitter, base and first and second collectors, said base of said second NPN transistor serving as said input of said second I²L circuit means, said first and second collectors of said second NPN transistor respectively serving as said first and second outputs of said second I²L circuit means and a second current source connected to said base of said second NPN transistor of said second I²L circuit means, said second current source providing a constant current $I_o$;

said third I²L circuit means comprises a third NPN transistor having an emitter, base and first and second collectors, said base of said third NPN transistor serving as said input of said third I²L circuit means, said first and second collectors of said third NPN transistor respectively serving as said first and second outputs of said third I²L circuit means and a third current source connected to said base of said third NPN transistor of said third I²L circuit means, said third current source providing a constant current $I_o$;

said fourth I²L circuit means comprises a fourth NPN transistor having an emitter, base and collector, said base of said fourth NPN transistor serving as said input of said fourth I²L circuit means, said collector of said fourth NPN transistor serving as the output of said fourth I²L circuit means and a fourth current source connected to said base of said fourth NPN transistor of said fourth I²L circuit means, said fourth current source providing a constant current $I_o$; and said fifth I²L circuit means comprises a fifth NPN transistor having an emitter, base and collector, said base of said fifth NPN transistor serving as said input of said fifth I²L circuit means, said collector of said fifth NPN transistor serving as said output of said fifth I²L circuit means and a fifth current source connected to said base of said fifth NPN transistor of said fifth I²L circuit means, said fifth current source providing a constant current $I_o$.

41. In a solid-state I²L static shift register having at least first, second and third I²L static shift register stages, said solid-state I²L static shift register including first coupling means for coupling said first stage to said second stage and second coupling means for coupling said second stage to said third stage, as recited in claim 40, wherein:

said first current source of said first I²L circuit means consists essentially of a PNP transistor having its collector connected to the base of said first NPN transistor of said first I²L circuit means;

said second current source of said second I²L circuit means consists essentially of a PNP transistor having its collector connected to the base of said second NPN transistor of said second I²L circuit means;

said third current source of said third I²L circuit means consists essentially of a PNP transistor having its collector connected to the base of said third NPN transistor of said third I²L circuit means;

said fourth current source of said fourth I²L circuit means consists essentially of a PNP transistor having its collector connected to the base of said fourth NPN transistor of said fourth I²L circuit means; and said fifth current source of said fifth I²L circuit means consists essentially of a PNP transistor having its collector connected to said base of said fifth NPN transistor of said fifth I²L circuit means.

* * * * *

UNITED STATES PATENT AND TRADEMARK OFFICE
CERTIFICATE OF CORRECTION

PATENT NO. : 4,348,595

DATED : Sep. 7, 1982

INVENTOR(S) : Gerard M. Lebesnerais

It is certified that error appears in the above—identified patent and that said Letters Patent is hereby corrected as shown below:

Column 6, line 22  change ">$\beta-1/\beta$" to read -- <$\beta 1/\beta$ --.

Column 14, line 21  "NPN" should read -- PNP --.

Column 19, line 24  "IL" should read -- $I^2L$ --.

Column 20, line 14  "IL" should read -- $I^2L$ --.

Signed and Sealed this

Nineteenth Day of June 1984

[SEAL]

Attest:

GERALD J. MOSSINGHOFF

Attesting Officer  Commissioner of Patents and Trademarks